US010700233B2

(12) United States Patent
Moayedi Pour Fard et al.

(10) Patent No.: US 10,700,233 B2
(45) Date of Patent: Jun. 30, 2020

(54) PHOTODETECTOR FOR DETECTING INCOMING INFRARED LIGHT

(71) Applicants: THE ROYAL INSTITUTION FOR THE ADVANCEMENT OF LEARNING/MCGILL UNIVERSITY, Montreal (CA); VALORBEC, L.P., Montreal (CA)

(72) Inventors: Monireh Moayedi Pour Fard, Austin, TX (US); Christopher Williams, Montreal (CA); Glenn Cowan, Montreal (CA); Odile Liboiron-Ladouceur, Montreal (CA)

(73) Assignees: THE ROYAL INSTITUTION FOR THE ADVANCEMENT OF LEARNING/MCGILL UNIVERSITY, Montreal (CA); VALORBEC L.P., Montreal (CA)

(*) Notice: Subject to any disclaimer, the term of this patent is extended or adjusted under 35 U.S.C. 154(b) by 0 days.

(21) Appl. No.: 16/150,921

(22) Filed: Oct. 3, 2018

(65) Prior Publication Data
US 2019/0103503 A1 Apr. 4, 2019

Related U.S. Application Data

(60) Provisional application No. 62/567,981, filed on Oct. 4, 2017.

(51) Int. Cl.
*H01L 31/103* (2006.01)
*H01L 27/144* (2006.01)
*G01J 1/16* (2006.01)

(52) U.S. Cl.
CPC .............. *H01L 31/103* (2013.01); *G01J 1/16* (2013.01); *H01L 27/144* (2013.01)

(58) Field of Classification Search
CPC .......... H01L 31/0236–02366; H01L 31/02327
See application file for complete search history.

(56) References Cited

U.S. PATENT DOCUMENTS 6,194,771 B1\* 2/2001 Kato ................. H01L 31/02161
257/436
2012/0049242 A1\* 3/2012 Atanackovic ... H01L 31/022441
257/184

(Continued)

OTHER PUBLICATIONS

Abid et al., "Optical Polarization Detection by a Lateral p-i-n Photodiode with Integrated Metal Grating", Specialty Optical Fibers Conference, Advanced Photonics Congress 2016, Jul. 18-20, 2016 (Year: 2016).\*

(Continued)

*Primary Examiner* — Selim U Ahmed
*Assistant Examiner* — Evan G Clinton
(74) *Attorney, Agent, or Firm* — Norton Rose Fulbright Canada LLP; Reno Lessard

(57) ABSTRACT

There is described a photodetector for detecting incoming infrared light. The photodetector generally has a substrate; an i-type semiconductor region extending along the substrate, the i-type semiconductor region being sandwiched between a p-type semiconductor region and an n-type semiconductor region; a grating coupler being optically connected to one of two ends of the i-type semiconductor region, the grating coupler redirecting incoming infrared light into and along the i-type semiconductor region via the one of the two ends of the i-type semiconductor region for propagation of infrared light along the i-type semiconductor region; and a photocurrent detection circuit electrically connected to the p-type semiconductor region and to the n-type semiconductor region for detecting a photocurrent resulting from said propagation.

20 Claims, 15 Drawing Sheets

(56) References Cited

U.S. PATENT DOCUMENTS

| | | | | |
|---|---|---|---|---|
| 2016/0155863 | A1* | 6/2016 | Baehr-Jones | H01L 31/1808 250/338.4 |
| 2016/0161331 | A1* | 6/2016 | Liu | H01L 31/18 250/552 |
| 2018/0102442 | A1* | 4/2018 | Wang | G02B 1/005 |
| 2018/0219120 | A1* | 8/2018 | Huang | G02B 6/12 |
| 2018/0316441 | A1* | 11/2018 | Yagisawa | H04B 10/40 |

OTHER PUBLICATIONS

Tatum, J. A., Gazula, D., Graham, L. A., Guenter, J. K., Johnson, R. H., King, J., . . . & Shaw, E. M. (2015). VCSEL-based interconnects for current and future data centers. Journal of Lightwave Technology, 33(4), 727-732.

Nakhkoob, B., Ray, S., & Hella, M. M. (2012). High speed photodiodes in standard nanometer scale CMOS technology: a comparative study. Optics express, 20(10), 11256-11270.

Lee, M. J. (2016). First CMOS silicon avalanche photodetectors with over 10-GHz bandwidth. IEEE Photonics Technology Letters, 28(3), 276-279.

Li, G., Maekita, K., Mitsuno, H., Maruyama, T., & Iiyama, K. (2015). Over 10 GHz lateral silicon photodetector fabricated on silicon-on-insulator substrate by CMOS-compatible process. Japanese Journal of Applied Physics, 54 (4S), 04DG06.

Wang, Y., Flueckiger, J., Lin, C., & Chrostowski, L. (Oct. 2013). Universal grating coupler design. In Photonics North 2013 (vol. 8915, p. 89150Y). International Society for Optics and Photonics.

Fard, M. M. P., Williams, C., Cowan, G., & Liboiron-Ladouceur, O. (Oct. 2016). A 35 Gb/s silicon photodetector for 850 nm wavelength applications. In Photonics Conference (IPC), 2016 IEEE (pp. 1-2). IEEE.

Fard, M. M. P., Williams, C., Cowan, G., & Liboiron-Ladouceur, O. (2017). High-speed grating-assisted all-silicon photodetectors for 850 nm applications. Optics Express, 25(5), 5107-5118.

Fard, M. M. P., Liboiron-Ladouceur, O., & Cowan, G. E. (2018). 1.23-pJ/bit 25-Gb/s Inductor-Less Optical Receiver With Low-Voltage Silicon Photodetector. IEEE Journal of Solid-State Circuits, 53(6), 1793-1805.

Tan, Z., Yang, C., Zhu, Y., Xu, Z., Zou, K., Zhang, F., & Wang, Z. (2018). A 70 Gbps NRZ optical link based on 850 nm band-limited VCSEL for data-center intra-connects. Science China Information Sciences, 61(8), 080406.

Csutak, S. M., Dakshina-Murthy, S., & Campbell, J. C. (2002). CMOS-compatible planar silicon waveguide-grating-coupler photodetectors fabricated on silicon-on-insulator (SOI) substrates. IEEE Journal of quantum electronics, 38(5), 477-480.

\* cited by examiner

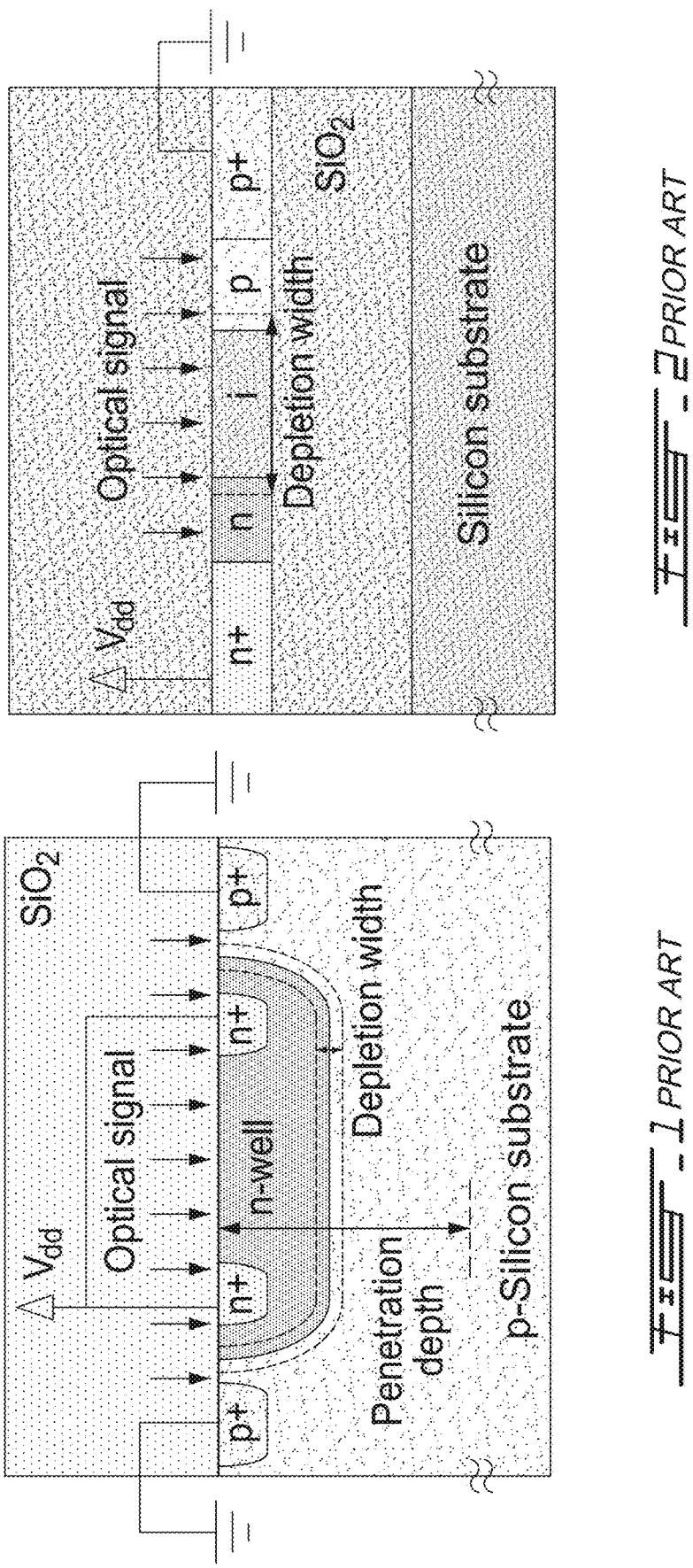

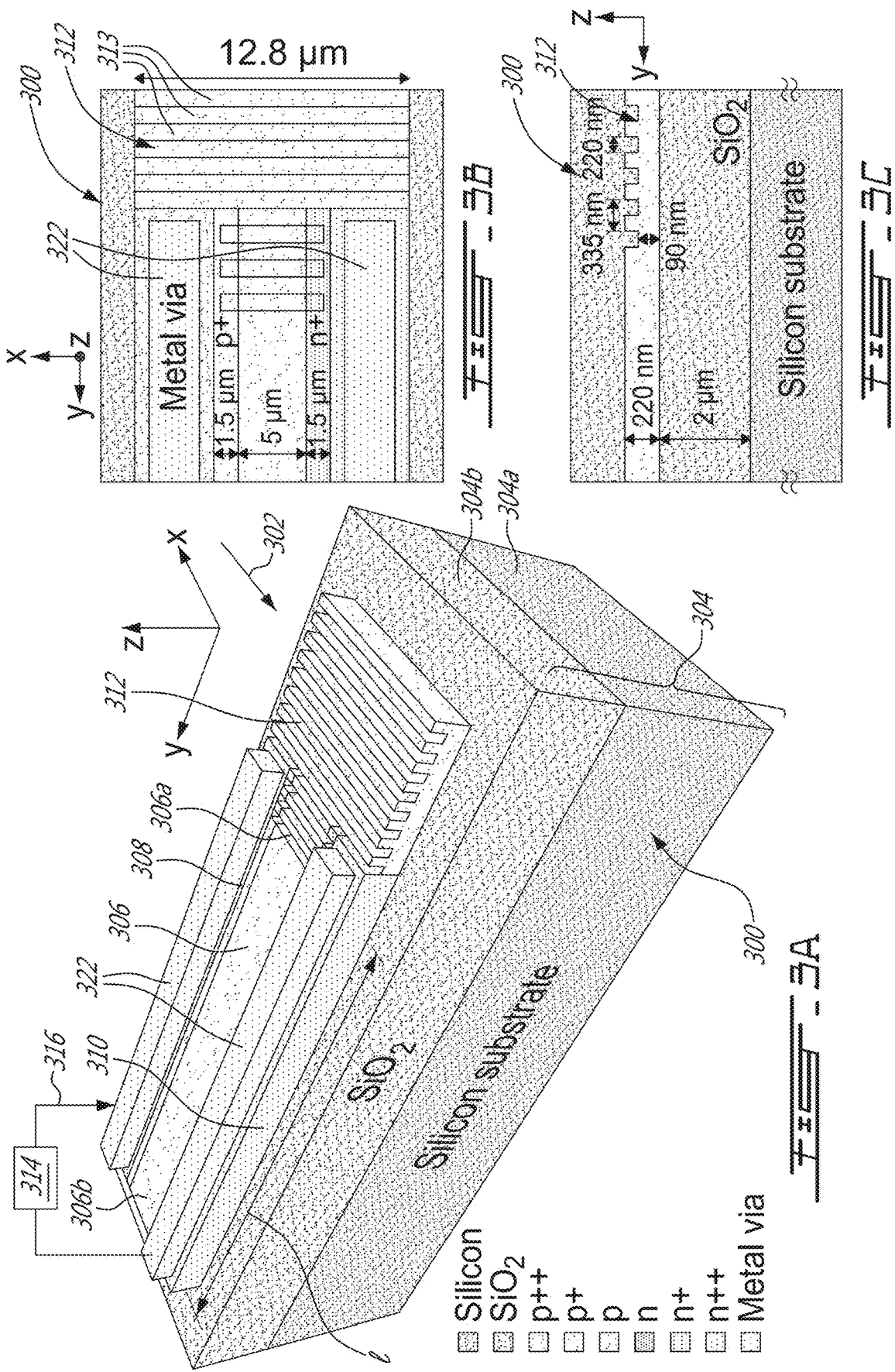

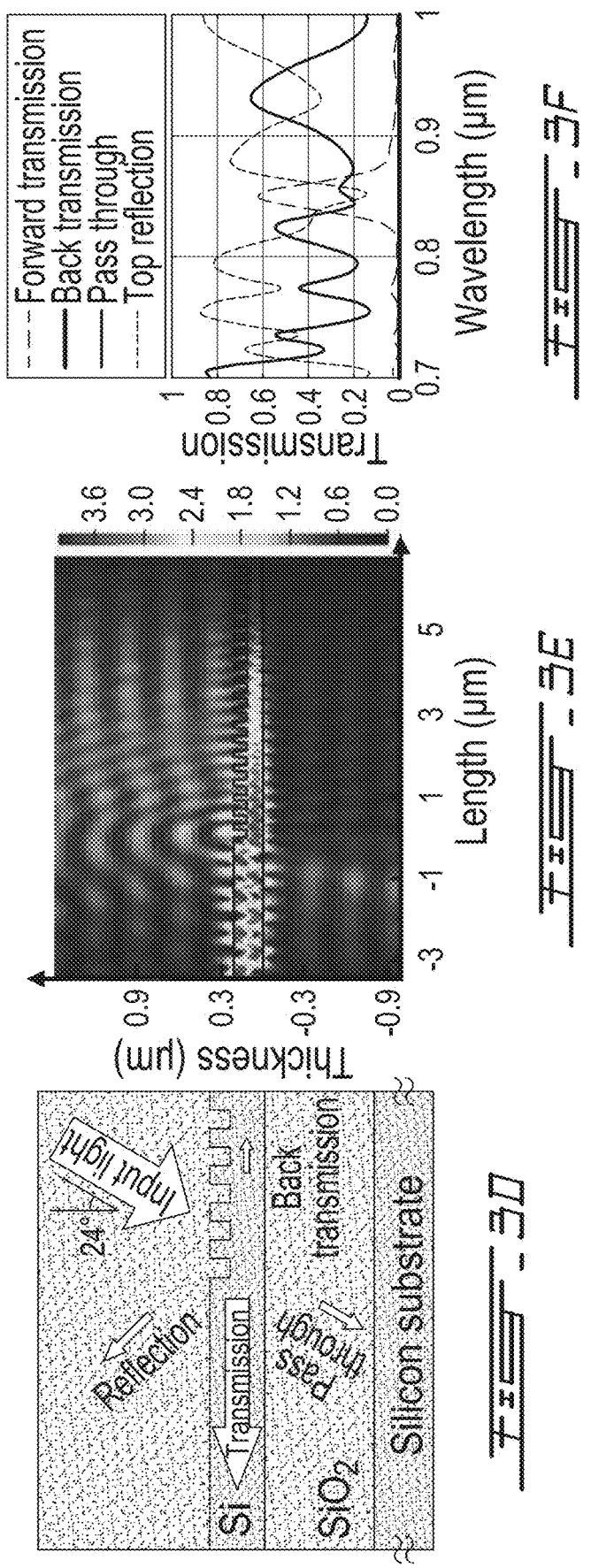

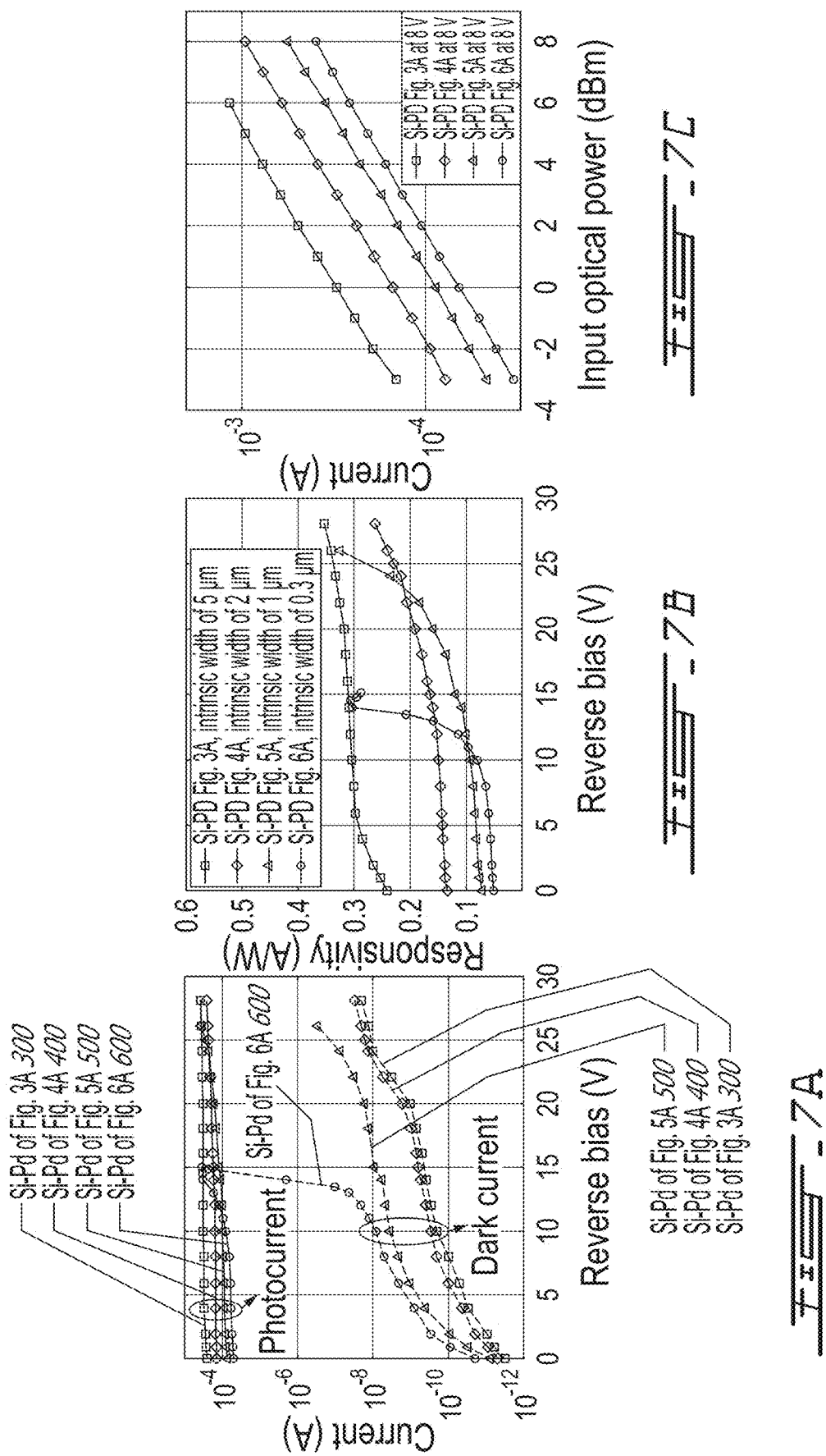

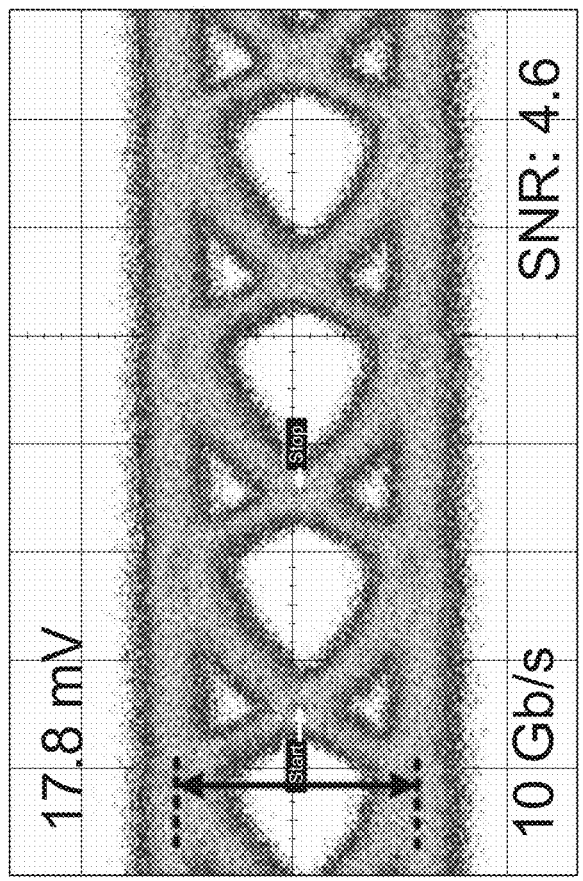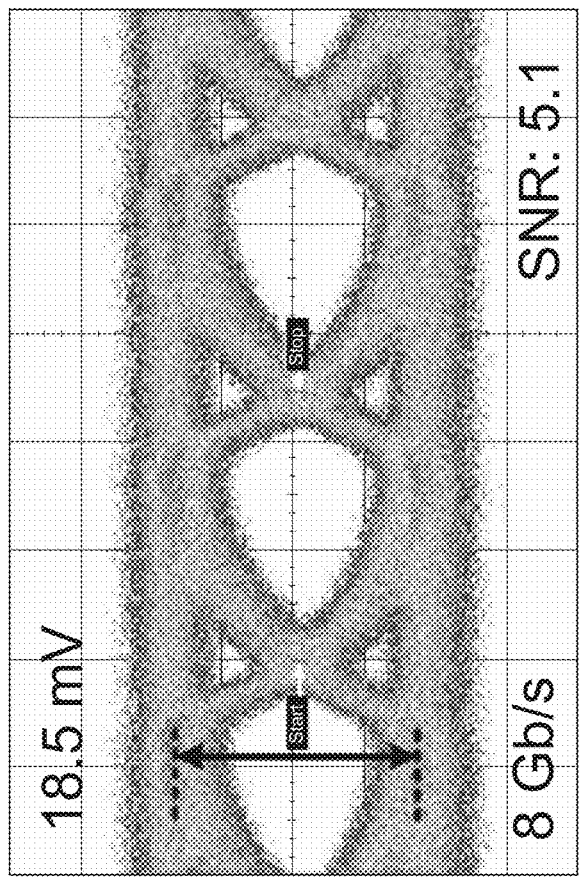
FIG - 10

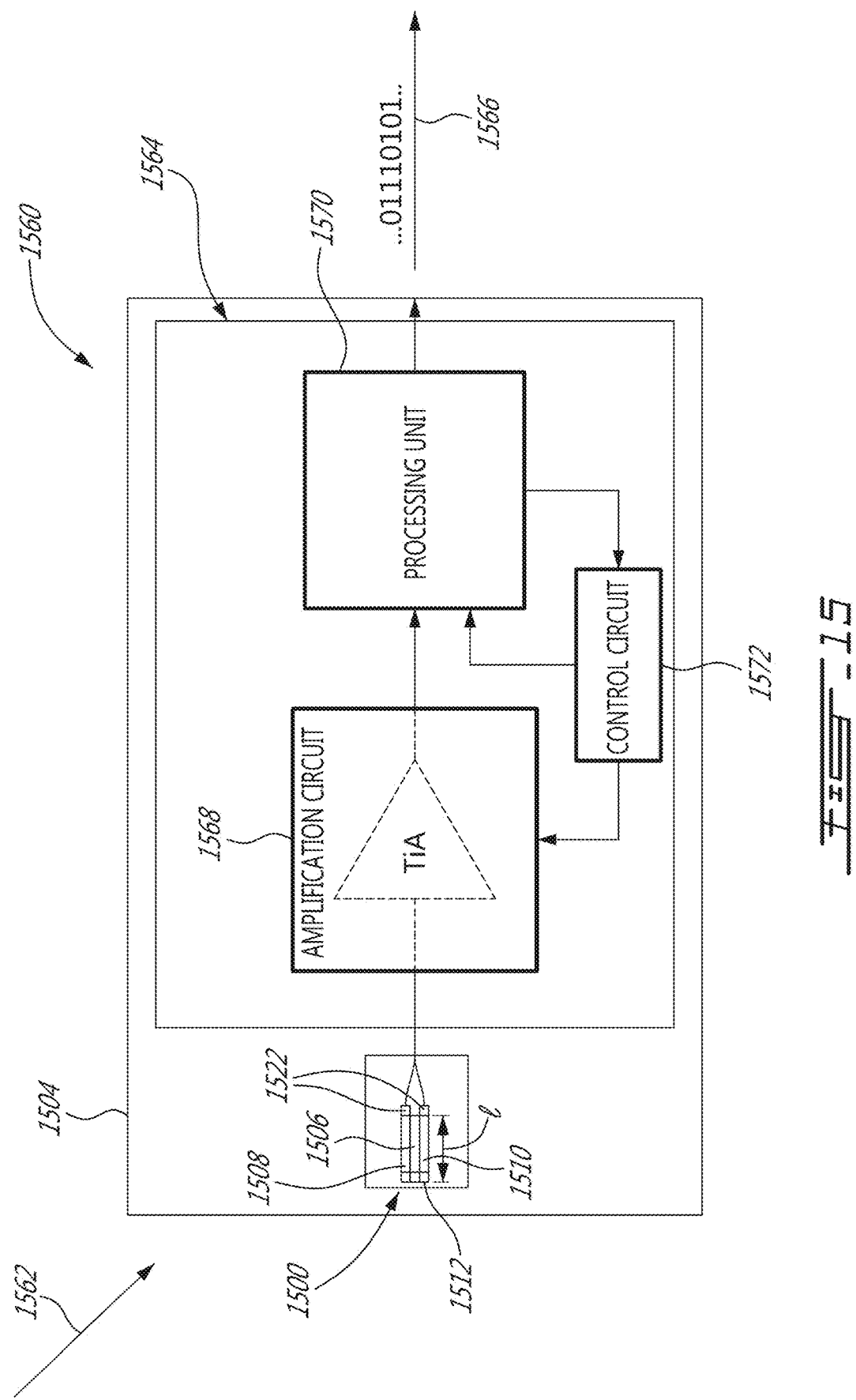

PHOTODETECTOR FOR DETECTING INCOMING INFRARED LIGHT

FIELD

The improvements generally relate to the field of photodetectors and more specifically relate to the field of photodetectors specifically suited for detecting incoming infrared light.

BACKGROUND

Over the last decades, bandwidth scaling in datacenters and supercomputers have pushed the need for high-speed short-reach optical interconnects. Low cost and energy efficiency are of interest, which makes the 850 nm wavelength directly modulated vertical cavity surface-emitting lasers (VCSELs) one solution for board-to-board and chip-to-chip connections in supercomputing systems and datacenters. Recently, significant improvements have been demonstrated in the performance of an 850 nm VCSEL for 50 Gb/s and beyond. High-speed, power efficient and high bandwidth density VCSEL-based short-reach optical interconnects with a hybrid integration of a photodetector have been demonstrated in the literature.

Silicon with high absorption coefficient at short wavelengths enables monolithic integration of an optical receiver with a photodetector. This integration reduces the cost and complexity of the packaging and provides a more reliable optical system. The combination of a low cost and power efficient 850 nm VCSEL with the monolithic integration of a silicon photodetector (Si-PD) and an optical receiver fabricated in a cost-effective, mature, and highly reliable complementary metal-oxide-semiconductor (CMOS) technology could be a cost-effective solution for short-reach optical interconnects.

FIG. 1 shows an example of a p-n Si-PD in a conventional bulk CMOS technology. Since the penetration depth of the 850 nm light in bulk silicon is larger than 10 µm, most of the photons are absorbed outside the depletion region. The slow diffusion current of carriers generated outside the depletion region limits the speed of the Si-PD to sub-GHz in bulk technology. Several techniques have been demonstrated to reduce the slow diffusion of carriers in Si-PDs at the cost of responsivity degradation. Most of the existing Si-PDs are designed for avalanche performance (avalanche photodetector (APD)) to increase the responsivity in the modified Si-PDs. However, to the inventors' knowledge, the maximum bandwidth reported of a Si-PD fabricated in a bulk CMOS technology is 12 GHz with a responsivity of 0.03 A/W and an avalanche gain of 10.6 at 9.7 V reverse-bias voltage.

The bandwidth of the Si-PD can be improved further by fabricating the photodetector on a silicon-on-insulator (SOI) platform. An example of a structure of a p-i-n Si-PD in a SOI technology is shown in FIG. 2. Elimination of the diffusion current by using the insulator between the active area of the Si-PD and the substrate improves the bandwidth of the PD without any equalization techniques. However, the responsivity of this type of PD is limited by the thickness of the silicon on the insulator. For instance, in the case of a 210-nm silicon layer, more than 98% of the vertically incident light passes through the silicon and limits the responsivity of the Si-PD to 0.0075 A/W. There thus remains room for improvement.

SUMMARY

In accordance with one aspect, there is provided a photodetector for detecting incoming infrared light, the photodetector comprising: a substrate; an i-type semiconductor region extending along the substrate, the i-type semiconductor region being sandwiched between a p-type semiconductor region and an n-type semiconductor region; a grating coupler being optically connected to one of two ends of the i-type semiconductor region, the grating coupler redirecting incoming infrared light into and along the i-type semiconductor region via the one of the two ends of the i-type semiconductor region for propagation of infrared light along the i-type semiconductor region; and a photocurrent detection circuit electrically connected to the p-type semiconductor region and to the n-type semiconductor region for detecting a photocurrent resulting from said propagation.

In one example, there is described a Si-PD using a grating coupler to direct the incident light horizontally to the i-type semiconductor region of the p-i-n diode. The proposed grating-assisted Si-PD can have a responsivity of 0.15 A/W and a dark current of 0.4 nA at 12 V reverse-bias voltage and can generate a clear 35 Gb/s eye diagram for PRBS-31 non-return-to-zero on-off keying (NRZ-OOK) data.

Such a lateral p-i-n silicon photodetector (Si-PD), which design, fabrication, and measurements are described herein, can be used for infrared light detection at 850 nm in a silicon-on-insulator (SOI) platform, as silicon has an absorption window at about 850 nm. As will be described herein, the incident infrared light is directed horizontally using a grating coupler, which can increase optical absorption in a depletion area of the Si-PD thereby increasing the Si-PD's responsivity. The measurements show that the grating coupler can increase the responsivity by 40 times compared with the Si-PD without a grating coupler. One example grating-assisted Si-PD has a 5 µm intrinsic width have exhibited a responsivity of 0.32 A/W and a dark current of 1 nA at 20 V reverse-bias voltage. Further, it can show an open eye diagram for 10 Gb/s PRBS-31 NRZ-OOK data and it has a 3-dB bandwidth of 4.7 GHz, a responsivity of 0.32 A/W, and a dark current of 1 nA at 20 V reverse-bias voltage.

In one specific example, an optimized grating-assisted Si-PD is provided with a focusing grating coupler and its p-i-n diode having a 0.3 µm intrinsic width. Such an optimized grating-assisted Si-PD has a responsivity of 0.3 A/W, an avalanche gain of 6, a dark current of 2 µA, and a 3-dB bandwidth of 16.4 GHz at 14 V reverse-bias voltage that, to the best of the inventors' knowledge, can be the largest 3-dB bandwidth reported for a Si-PD. As a result, it can have a figure of merit (FoM) of 4920 GHzp×mA/W. Further, it can show an open eye diagram of 35 Gb/s PRBS-31 NRZ-OOK data.

In accordance with another aspect, there is provided a photodetector comprising: a substrate; an i-type semiconductor region being mounted to the substrate and having a length, p-type and n-type semiconductor regions being mounted to the substrate and sandwiching the i-type semiconductor region along at least said length; a grating coupler being mounted to the substrate and being optically coupled to one of two ends of the i-type semiconductor region, the grating coupler redirecting incoming light into and along the i-type semiconductor region via the one of the two ends of the i-type semiconductor region for propagation of said light along the i-type semiconductor region; and electrical contacts electrically connected to the p-type semiconductor region and to the n-type semiconductor region.

In accordance with another aspect, there is provided an optical receiver comprising: a substrate; a photodetector having an i-type semiconductor region being mounted to the substrate and having a length, p-type and n-type semiconductor regions being mounted to the substrate and sandwiching the i-type semiconductor region along at least said length; a grating coupler being mounted to the substrate and being optically coupled to one of two ends of the i-type semiconductor region, the grating coupler redirecting an incoming optical data signal into and along the i-type semiconductor region via the one of the two ends of the i-type semiconductor region for propagation of said optical data signal along the i-type semiconductor region; and electrical contacts electrically connected to the p-type semiconductor region and to the n-type semiconductor region; and an output signal processing circuit being electrically connected to the electrical contacts of the photodetector and being configured for outputting an electrical data signal based on a photocurrent resulting from said propagation.

Many further features and combinations thereof concerning the present improvements will appear to those skilled in the art following a reading of the instant disclosure.

DESCRIPTION OF THE FIGURES

In the figures,

FIG. 1 is a side view of an example of a p-n Si-PD, made with bulk CMOS technology, in accordance with the prior art;

FIG. 2 is a side view of an example of a p-i-n Si-PD, made with SOI technology, in accordance with the prior art;

FIG. 3A is an oblique view of an example of a SOI-based grating-assisted Si-PD, with an intrinsic band having a thickness of 5 µm, in accordance with an embodiment;

FIG. 3B is a top view of the SOI-based grating-assisted Si-PD of FIG. 3A;

FIG. 3C is a side view of the SOI-based grating-assisted Si-PD of FIG. 3A;

FIG. 3D is a side view of the SOI-based grating-assisted Si-PD of FIG. 3A, showing directions of the incoming and coupled light;

FIG. 3E is a side view of the SOI-based grating-assisted Si-PD of FIG. 3A, showing the electric field coupled to the silicon waveguide for 24 degrees angled light at a wavelength of 850 nm;

FIG. 3F is a graph showing simulated transmission for the forward transmission, back transmission, pass-through, and top reflection in the SOI-based grating-assisted Si-PD of FIG. 3A;

FIG. 7A is a graph showing DC measurements representative of dark current and photocurrent for the Si-PDs of FIGS. 3A, 4A, 5A, and 6A illuminated with 0 dBm CW light;

FIG. 7B is a graph showing the responsivity of the Si-PDs of FIGS. 3A, 4A, 5A, and 6A;

FIG. 7C is a graph showing measured photocurrent of the Si-PDs of FIGS. 3A, 4A, 5A, and 6A for various received optical power at 8 V reverse-bias voltage;

FIG. 10 shows graphs of exemplary output electrical eye diagrams obtained with the Si-PD of FIG. 3A with an intrinsic width of 5 µm at 20 V reverse-bias voltage;

FIG. 12 shows graphs of exemplary output electrical eye diagrams of the Si-PD of FIG. 5A with an intrinsic width of 1 µm and three-finger p-i-n diodes at 20 V reverse-bias voltage;

FIG. 15 is a schematic view of an example of an optical receiver, in accordance with an embodiment.

DETAILED DESCRIPTION

Figures 4A, 4B:
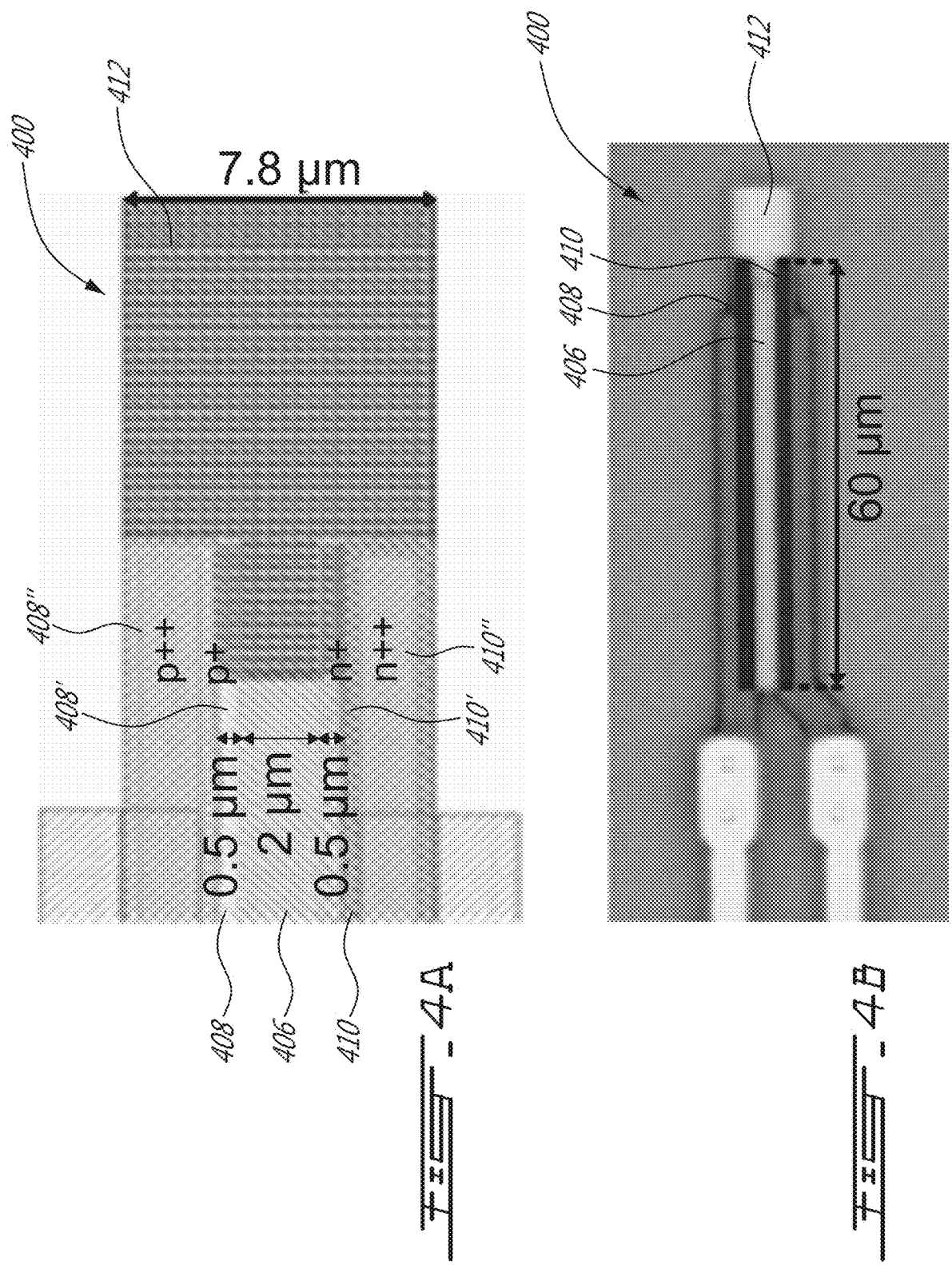
FIG. 4A is a top view of another example of a SOI-based grating-assisted Si-PD, with a grating coupler overlapping with a p-i-n diode and an intrinsic width smaller than an incident mode size, in accordance with an embodiment.
FIG. 4B is a top view image of the SOI-based grating-assisted Si-PD of FIG. 4A.

FIGS. 3A, 3B and 3C show an example of a photodetector 300 for detecting incoming infrared light 302. In this example, the photodetector 300 has a substrate 304, and an i-type semiconductor region 306 which is mounted to the substrate 304 and having a length I. The photodetector 300 also has p-type semiconductor region 308 and an n-type semiconductor region 310 being both mounted to the substrate 304 and sandwiching the i-type semiconductor region 306 along at least the length I. As shown a grating coupler 312 is mounted to the substrate 304 and is optically connected to one of two ends 306a and 306b of the i-type semiconductor region 306. The grating coupler 312 redirects the incoming infrared light 302 into and along the i-type semiconductor region 306 via the end 306a of the i-type semiconductor region 306 for propagation of infrared light along the i-type semiconductor region 306. Electrical contacts 322 are electrically connected to the p-type and n-type semiconductor regions 308 and 310.

As can be understood, a photocurrent detection circuit 314 can be electrically connected to the p-type semiconductor region 308 and to the n-type semiconductor region 310, via the electrical contacts 322, for detecting a photocurrent 316 resulting from said propagation.

In this embodiment, the substrate 304 includes a bottom layer 304a of silicon on which is disposed a top layer 304b of silicon dioxide. More specifically, the i-type, p-type, n-type semiconductor regions 306, 308 and 310 along with the grating coupler 302 are mounted to the top layer 304b. Accordingly, the photodetector 300 can be referred to as a silicon photodiode (Si-PD). In this example, it was also found convenient to provide the p-type and n-type semiconductor regions 306 and 308 with first and second electrical contacts 322, respectively. As shown, the electrical contacts 322 can each be provided in the form of a metal via.

The i-type (or intrinsic) semiconductor region 306, the p-type semiconductor region 308 and the n-type semiconductor region 310 can collectively form a lateral p-i-n structure or p-i-n diode extending along the y-axis such as described in B. Yang, J. D. Schaub, S. M. Csutak, D. L. Rogers, J. C. Campbell, "10-Gb/s all-silicon optical receiver," IEEE Photonics Technol. Lett. 15(5), 745-7477 (2003) or in G. Li, K. Maekita, H. Mitsuno, T. Maruyama, and K. Iiyama "Over 10 GHz lateral silicon photodetector fabricated on silicon-on-insulator substrate by CMOS-compatible process," Jpn. J. Appl. Phys. 54(4S), 04DG06 (2015). However, rather than directing light through the depletion region in the z-direction, to increase the absorption of light in the depletion region, the grating coupler 312 directs light in the y-direction along the i-type semiconductor region. Since the silicon waveguide is highly absorptive at 850 nm, the grating coupler 312 is adjacent to or possibly overlapping the p-i-n diode.

The grating coupler 312 is designed for 850 nm wavelength based on an analytic calculation of the Bragg condition. It is further optimized through 2D and 3D finite-difference time-domain (FDTD) simulations using commercially available technology computer-aided design (TOAD) tools from Lumerical. The dimensions of the Si-PD 300 are shown in FIGS. 3B and 3C. More specifically, as shown in FIG. 3B, the i-type semiconductor region has a thickness of about 5 µm along the x-orientation, and the p-type and n-type semiconductor regions 308 and 310 both have a thickness of about 1.5 µm along the x-orientation. As shown in FIG. 3C, the top layer 304b of buried oxide (i.e. silicon dioxide) has a depth of about 2 µm along the z-orientation whereas the i-type semiconductor region 306 has a depth of about 220 nm along the z-orientation. Moreover, the grating coupler 312 has a series of step-like corrugations 313 which have a period of 355 nm and which dips are of about 200 nm in the y-orientation and of about 130 nm in the z-orientation. FIG. 3E shows the side view of the electric field coupled to the silicon waveguide when the grating coupler 312 is illuminated at 850 nm wavelength at an angle of 24 degrees from normal as shown in FIG. 3D. In this simulation, the silicon is considered lossless for calculating the efficiency of the grating coupler 312. The software simulates the forward transmission, back transmission, top reflection, and pass through transmission as shown in FIG. 3F.

Simulation results show a coupling efficiency of 62% for a grating coupler larger than the fiber mode field diameter (~5 µm for a single-mode 850 nm fiber) of the incident light. The maximum responsivity (R) at 850 nm can therefore be 0.425 A/W. Using a grating coupler smaller than the fiber mode diameter degrades the coupling efficiency. Further, due to the silicon loss at this wavelength, part of the light will be absorbed before reaching the p-i-n region, reducing the responsivity. Considering an absorption coefficient of 1000 $cm^{-1}$ at 850 nm for thin-film silicon, a 220 nm silicon layer without a grating coupler may absorb only 2% of vertically illuminated light leading to a maximum responsivity of 0.013 A/W.

The width of the i-type semiconductor region 306 and the size, location, and doping density of the p-type and n-type semiconductor regions 308 and 310 determine the speed of the SOI grating-assisted Si-PD 300. Three doping levels are available for the p-doped and n-doped silicon in the fabrication process in which the proposed Si-PDs are fabricated. Doping densities were found using Sentaurus Device simulation software for the specific doping dose and doping energy for each doping layer. The average doping densities for the p++, p+, p, n++, n+ and n layers were found to be $1.2 \times 10^{20}$ $cm^{-3}$, $1.8 \times 10^{18}$ $cm^{-3}$, $4 \times 10^{17}$ $cm^{-3}$, $3.3 \times 10^{20}$ $cm^{-3}$, $3 \times 10^{18}$ $cm^{-3}$, $3.2 \times 10^{17}$ $cm^{-3}$, respectively. In the Si-PD 300 of FIG. 3A, the doping levels of p++, p+, n+ and n++ were used. The length l of the i-type semiconductor region is 60 µm, and the intrinsic width is 5 µm to maximize the responsivity. The parasitic capacitance and resistance of the Si-PD 300 are estimated to be 0.27 fF and 39Ω, respectively. Considering the carrier velocity saturation in silicon to be $10^7$ cm/s, the time constant related to the carrier transit time for the intrinsic width of 5 µm would be approximately 50 ps while the RC time constant is approximately 0.01 ps. Therefore, the speed of the photodetector 300 can be mainly limited by the carrier transit time.

FIGS. 4A to 6B describe three embodiments of the proposed grating-assisted Si-PD in SOI technology. Shrinking the width of the i-type semiconductor region in the p-i-n diode reduces the carrier transit time. As a result, the speed of the PD improves as long as the bandwidth is limited only by the carrier transit time. Two approaches are considered to shrink the i-type semiconductor region. In the first approach, the designed grating coupler from the baseline Si-PD is overlapped with p-i-n diodes with their intrinsic width smaller than the incident mode diameter of the input fiber. Therefore, part of the coupled light would be absorbed outside the i-type semiconductor region which may generate diffusion current and degrade the speed of the Si-PD. Further, in this approach, a grating coupler area smaller than the incident mode size is used which degrades the photodetector responsivity due to reduced coupling efficiency. In a second approach, the fiber mode is transferred into a small waveguide mode through a gradually tapered waveguide. The straight grating coupler used in the Si-PD 300 of FIG. 3A requires a tapered waveguide longer than 100 µm to transfer the mode with low reflection. Consequently, the coupled mode would be absorbed before reaching the p-i-n diode i-type semiconductor region. To reduce the length of the tapered waveguide, a focusing grating coupler (FGC) is designed for 850 nm wavelength.

FIG. 4A shows a top view of an example of a Si-PD 400 using a first approach of shrinking the intrinsic width, with an i-type semiconductor region 406 sandwiched between a p-type semiconductor region 408 and an n-type semiconductor region 410. In this example, the p-type semiconductor region 408 has a proximal p+ semiconductor region 408' and a distal p++ semiconductor region 408" whereas the n-type semiconductor region 410 having a proximal n+ semiconductor region 410' and a distal n++ semiconductor region 410". A grating coupler 412 is optically connected to an end of the i-type semiconductor region 406. As depicted, the Si-PD has a similar design as that of the Si-PD 300 but with an intrinsic width of 2 µm and p+ and n+ doping widths of 0.5 µm. In comparison with Si-PD 300, the 2.5 times smaller intrinsic width in Si-PD 400 leads to a larger parasitic capacitance of 0.69 fF for the p-i-n diode length l of 60 µm. However, the carrier transit time is 2.5 times smaller than Si-PD of FIG. 3A. The parasitic resistance is estimated to be 32Ω.

Figures 5A, 5B:
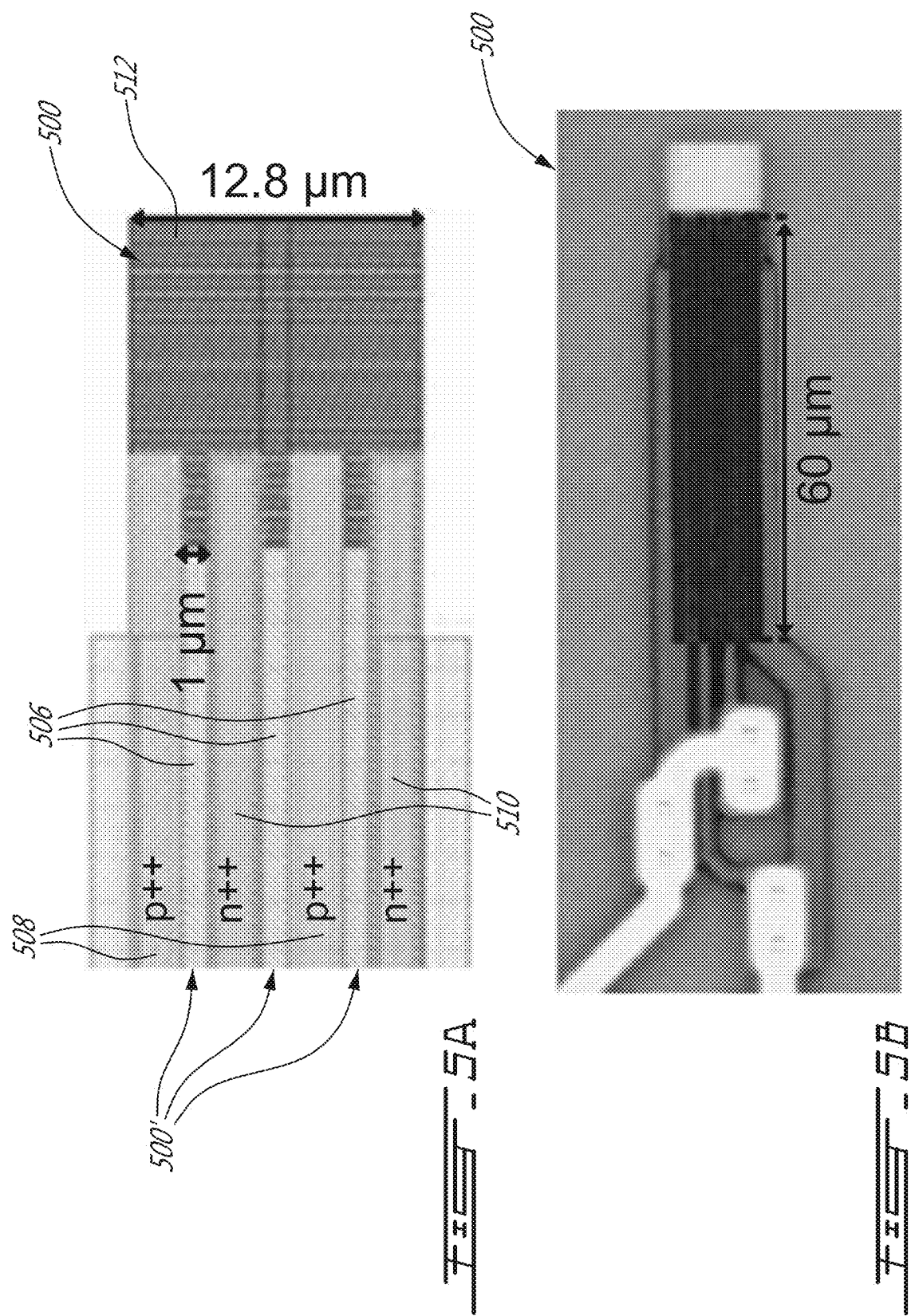
FIG. 5A is a top view of another example of a SOI-based grating-assisted Si-PD, with an grating coupler overlapping a three-finger PD, in accordance with an embodiment.
FIG. 5B is a top view image of the SOI-based grating-assisted Si-PD of FIG. 5A.

FIG. 5A shows a top view of an example of a grating-assisted Si-PD 500, with i-type semiconductor regions 506 sandwiched between p-type semiconductor regions 508 and n-type semiconductor regions 510. A grating coupler 512 is optically connected to an end of the i-type semiconductor region 406. The Si-PD 500 also uses the first approach for reducing the intrinsic width to 1 µm as shown in FIG. 4A. Three small PDs 500' are combined to improve the responsivity and only the p++ and n++ doping layers are used. The parasitic capacitance and resistance of the Si-PD 500 are estimated to be 4.1 fF and 9.5Ω, respectively, for i-type semiconductor regions 506 of a length I of 60 μm.

Figures 6A, 6B:
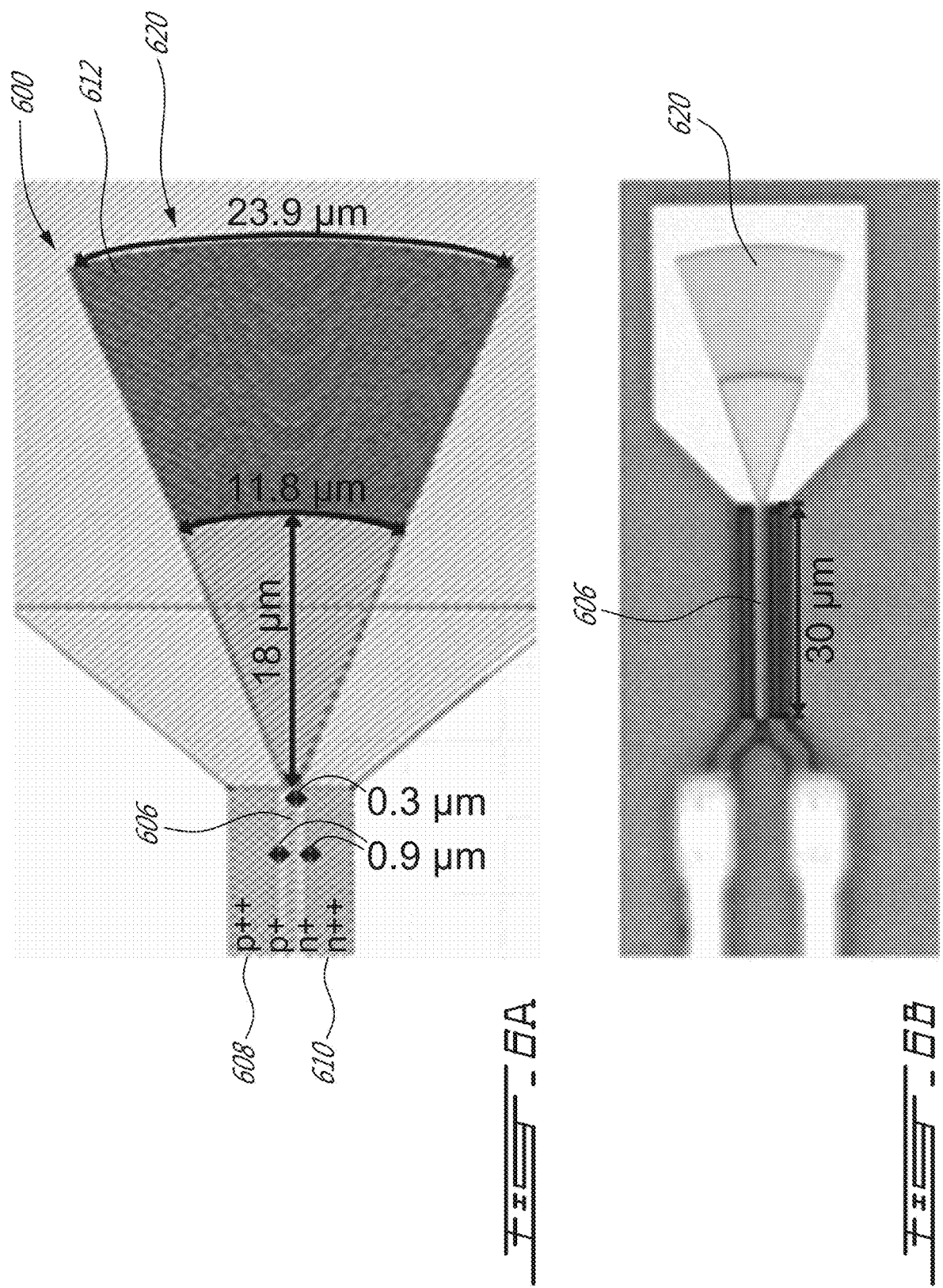
FIG. 6A is a top view of another example of a SOI-based grating-assisted Si-PD, with a focusing grating coupler, in accordance with an embodiment.
FIG. 6B is a top view image of the SOI-based grating-assisted Si-PD of FIG. 6A.

FIG. 6A shows a top view of an example of a grating-assisted Si-PD 600 with an i-type semiconductor region 606 sandwiched between a p-type semiconductor region 608 and an n-type semiconductor region 610. A grating coupler 612 is optically connected to an end of the i-type semiconductor region 606. However, in this embodiment, the grating coupler 612 is provided in the form of a focusing grating coupler 620. As illustrated, the focusing grating coupler 620 has a taper shape which decreases in width towards the i-type semiconductor region 606 of the Si-PD 600. In this case, the focusing grating coupler 620 is specifically designed to couple infrared light at 850 nm. As such, the focusing grating coupler 620 couples the incident light into a 500 nm width rib waveguide with 0.3 μm intrinsic width. The narrow intrinsic width reduces the carrier transit time enabling high-speed performance. Further, the narrow width enables an avalanche behavior at a reverse-bias voltage lower than 20 V. The p+ and n+ doping widths are both 0.9 μm and the length I of the i-type semiconductor region 606 is 30 μm. The responsivity of this photodetector 600 at low reverse-bias voltage is lower than the other Si-PDs 300, 400 and 500 since only 17% of the coupled light reaches to the p-i-n diode. However, due to the avalanche behavior, the responsivity improves considerably at high reverse-bias voltage. The parasitic capacitance and resistance of this Si-PD 600 are estimated to be 2.3 fF and 57Ω, respectively. It is expected that the photodetector 600 provides the largest bandwidth compared to the other three Si-PDs 300, 400 and 500 since the carrier transit time is approximately 3 ps. The four proposed grating-assisted Si-PDs discussed above were fabricated at the Institute of Microelectronics IME-A*Star. Further, two extra Si-PDs similar to the grating-assisted Si-PDs 300 and 500 but without grating coupler have been fabricated to study the coupling efficiency of the grating couplers.

The following paragraphs present the measurements of the SOI-based grating-assisted Si-PDs 300, 400, 500 and 600 and compares them with previously published Si-PDs. The dark current of the grating-assisted Si-PDs 300, 400, 500 and 600 for various reverse-bias voltages is first measured with a precise ammeter (Keithley, sensitivity: 0.1 pA). Then, the responsivity is calculated from the measured photocurrent for an injected continuous wave (CW) at 848.2 nm wavelength generated by a VCSEL source from Thorlabs. FIG. 7A is the measured dark current, and the photocurrent for 0 dBm illuminated CW light for various reverse-bias voltages. The responsivity of the designed grating-assisted Si-PDs 300, 400, 500 and 600 with respect to reverse-bias voltage is shown in FIG. 7B. FIG. 7C plots the variation in photocurrent with respect to the received optical power at 8 V reverse-bias voltage.

The Si-PD 300 of FIG. 3A (baseline Si-PD) has the largest responsivity of 0.24 A/W at 0 V reverse-bias voltage compared to the other three Si-PDs 400, 500 and 600. A Si-PD with the same structure as the grating-assisted Si-PD 300 of FIG. 3A, but without the grating coupler 312 has a responsivity of 0.006 A/W at 0 V reverse-bias voltage. As such, the grating coupler 312 can improve the responsivity by 40 times. By increasing the reverse-bias voltage of Si-PD 300 of FIG. 3A, the responsivity increases to 0.3 A/W for voltages larger than 6 V. The responsivity remains almost flat up to 18 V and gradually increases for larger voltages. The measured dark current is lower than 1 nA for a reverse-bias voltage lower than 20 V. At high reverse-bias voltages, the responsivity increases due to impact ionization. Si-PD 400 of FIG. 4A with a smaller intrinsic width (2 μm) has a responsivity of 0.133 at 0 V reverse-bias voltage. The responsivity increases to 0.19 A/W at 20 V with a dark current lower than 2 nA at this bias voltage.

The Si-PD 500 of FIG. 5A has a 1 μm intrinsic width and three diode fingers 500' has a responsivity of 0.071 A/W at 0 V reverse-bias voltage. A Si-PD with the same structure as the Si-PD 500 of FIG. 5A but without the grating coupler 512 has a responsivity of 0.0043 A/W at 0 V. Here, the grating coupler 512 can increase the responsivity by more than 16.5 times. Overlapping the p-i-n diodes 500' with a small intrinsic width reduces the light coupling improvement by 59% in comparison to Si-PD 300 of FIG. 3A due to the discontinuity of the grating coupler in the overlapped area and the interference of the metal via on the light coupling. The responsivity of Si-PD 500 of FIG. 5A increases to 0.324 A/W at 26 V reverse-bias voltage with a dark current lower than 0.3 pA. Increasing the reverse-bias voltage improves the responsivity by more than 4.5 times.

The Si-PD 600 of FIG. 6A with a focusing grating coupler 620 and 0.3 μm intrinsic width has the lowest responsivity of 0.05 A/W at 0 V reverse-bias voltage compared to the other three Si-PDs 300, 400 and 500. However, the responsivity rapidly increases for a reverse-bias voltage larger than 10 V. The Si-PD 600 of FIG. 6A has a responsivity of 0.3 A/W and dark current of 2 μA at 14 V reverse-bias voltage. By increasing the reverse-bias voltage to larger than 14.4 V, the photocurrent saturates and the responsivity degrades due to the space-charge effect that reduces the electric field in the center of the i-type semiconductor region 606.

Figure 8B:
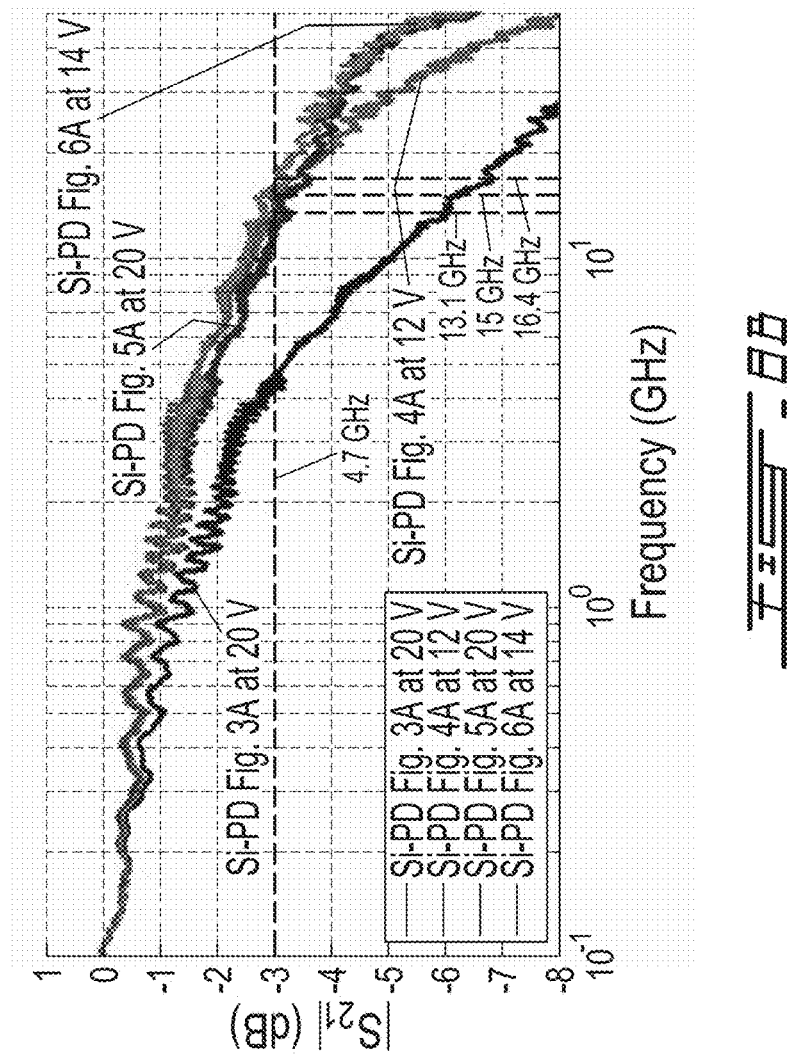
FIG. 8B is a graph showing the S-parameter $S_{21}$ OE as function of frequency for the Si-PD of FIGS. 3A, 4A, 5A and 6A. (b) Measured frequency response of the grating-assisted Si-PDs.
Figure 8A:
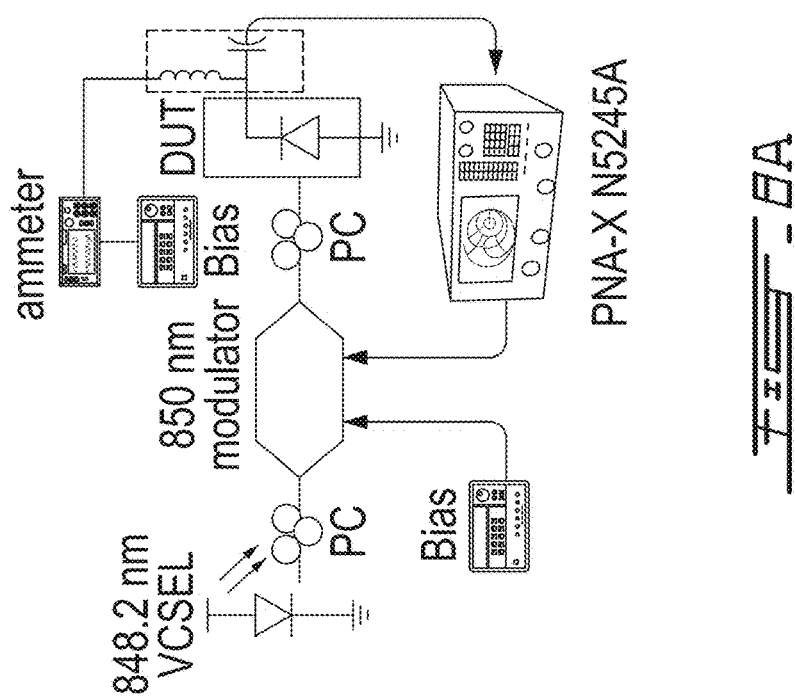
FIG. 8A is schematic view of an example of an experimental setup for measuring a S-parameter of a Si-PD.

Next, the optical-electrical (OE) bandwidths of the grating-assisted Si-PDs 300, 400, 500 and 600 are calculated from the S-parameters ($S_{21}$) measured by a 50 GHz microwave network analyzer (Agilent PNA-X N5245A). FIG. 8A illustrates the test bed for the S-parameter measurements. The CW light generated by a VCSEL source from Thorlabs at 848.2 nm is injected through a polarization controller (PC) into a 40 GHz Mach-Zehnder modulator (MZM). The microwave network analyzer drives the MZM to modulate the CW light. Since the input grating coupler is polarization sensitive, the modulated data is then injected to another PC. The grating-assisted Si-PD detects the modulated data, converting it to a photocurrent, which is then injected into the second port of the microwave network analyzer through a 65 GHz bias tee that also provides the bias voltage for the photodetector. By increasing the reverse-bias voltage, the bandwidth of the Si-PDs increases and then saturates at high voltages. The reverse-bias voltage of each Si-PD is selected to be in the range where the bandwidth improvement is negligible. FIG. 8B plots the measured $S_{21}$ of the designed grating-assisted Si-PDs 300, 400, 500 and 600. To compare the 3-dB bandwidth of the Si-PDs, each curve is normalized to its $S_{21}$ value at 100 MHz frequency.

The Si-PD 300 of FIG. 3A shows the lowest bandwidth of 4.7 GHz at 20 V reverse-bias voltage in comparison with the other proposed Si-PDs. Although Si-PD 500 of FIG. 5A has a smaller intrinsic width than Si-PD 400 of FIG. 4A, it has lower OE bandwidth due to a larger diffusion current. The focusing grating-assisted Si-PD 600 of FIG. 6A has the largest bandwidth (16.4 GHz at 14 V reverse-bias voltage).

Figure 9:
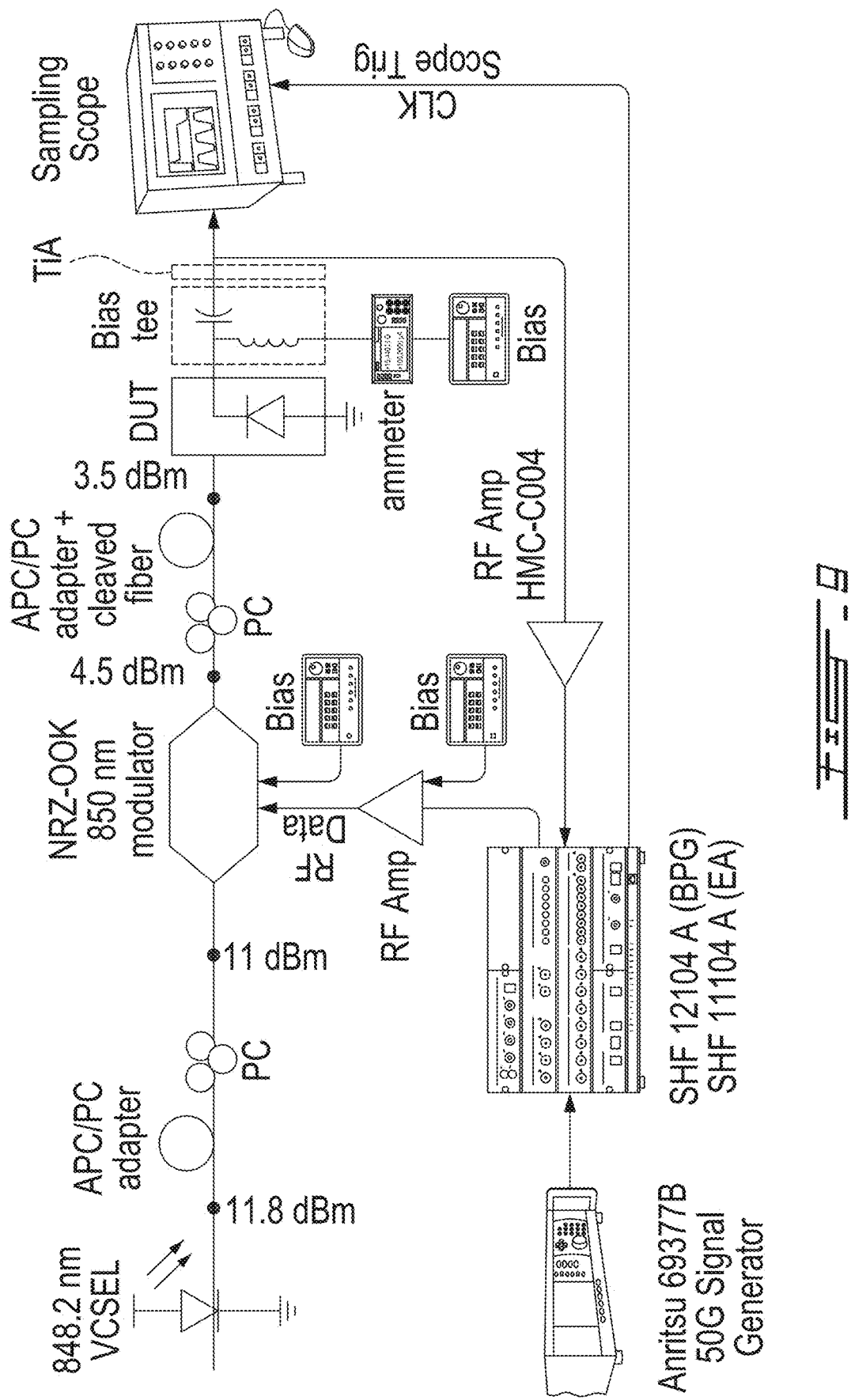
FIG. 9 is a graph showing an example of an experimental setup for obtaining eye diagrams and BER measurements.

Following the DC and frequency response measurements, the eye diagrams are captured. Further, the bit error rates (BER) of the Si-PDs 400 and 500 are measured. Then, the performance of the proposed grating-assisted Si-PDs is compared with the performance of published high-speed Si-PDs. FIG. 9 illustrates the test bed for the eye diagram and BER measurements. The bit pattern generator (BPG) generates PRBS-31 data, and the error analyzer (EA) measures the error rate of the signal detected by the PD. The CW generated by the VCSEL source with 11.8 dBm optical power at 848.2 nm is injected through a PC with 0.5 dB insertion loss. A 40 GHz MZM with insertion loss of 6.5 dB at 850 nm is driven by the baseband signal from the output of the BPG. The modulated data is then injected to another PC. The optical power at the input grating coupler of the device is 3.5 dBm. The modulated optical signal is launched to the Si-PD and converted to a photocurrent. The 50Ω termination of test equipment converts the photocurrent into a voltage. The photodetector is biased through a 65 GHz bias tee while its current is simultaneously measured with the precise ammeter. Since the amplitude of the detected signal is smaller than the sensitivity of the EA, a 12 GHz low noise amplifier amplifies the detected signal for BER measurement.

To change the signal-to-noise ratio (SNR) for BER measurement, the position of the input fiber is shifted. Shifting the fiber from the optimum position reduces the received optical power and as a result, it degrades the SNR. The corresponding average optical power is calculated based on the monitored photocurrent.

The measured eye diagram for Si-PD 300 of FIG. 3A with an intrinsic width of 5 µm at 20 V reverse-bias voltage for 8 Gb/s and 10 Gb/s PRBS-31 NRZ-OOK are shown in FIG. 10.

Figure 11:
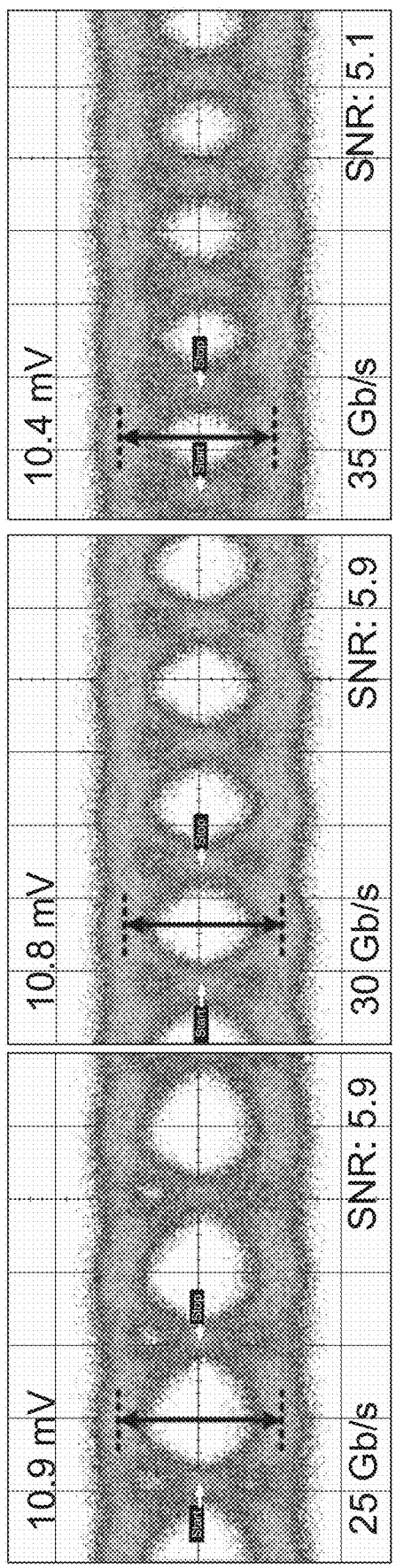
FIG. 11 shows graphs of exemplary output electrical eye diagrams of Si-PD of FIG. 4A with an intrinsic width of 2 µm at 12 V reverse-bias voltage.
Figure 17:
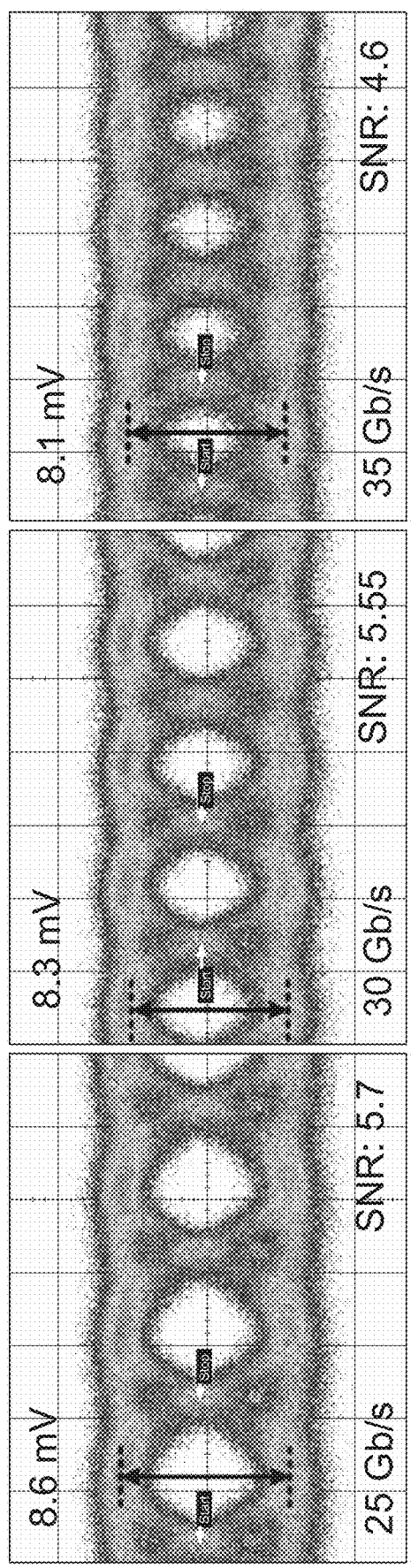

FIG. 11 plots the measured eye diagram for Si-PD 400 of FIG. 4A with an intrinsic width of 2 µm at 12 V reverse-bias voltage for 25 Gb/s, 30 Gb/s and 35 Gb/s PRBS-31 NRZ-OOK data.

Figure 13:
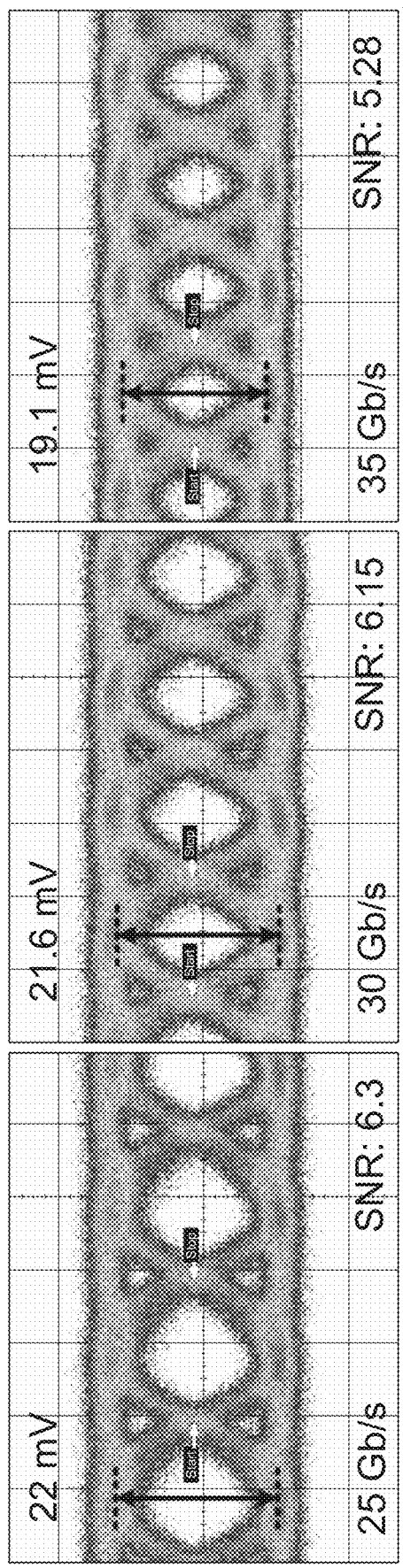
FIG. 13 shows graphs of exemplary output electrical eye diagrams of the Si-PD of FIG. 6A with focusing grating coupler and an intrinsic width of 0.3 µm at 14 V reverse-bias voltage.

The eye diagrams for multi-finger Si-PD 500 of FIG. 5A with an intrinsic width of 1 µm at 20 V reverse-bias voltage for 25 Gb/s, 30 Gb/s and 35 Gb/s PRBS-31 NRZ-OOK data are shown in FIG. 12. FIG. 13 illustrates the eye diagrams for Si-PD 600 of FIG. 6A with the focusing grating coupler 620 and an intrinsic width of 0.3 µm and at 14 V reverse-bias voltage for 25 Gb/s, 30 Gb/s and 35 Gb/s PRBS-31 NRZ-OOK data.

As it is expected from the frequency response measurement, the Si-PD 300 of FIG. 3A can support a bit rate of 10 Gb/s. The other three Si-PDs 400, 500 and 600 show open eye diagrams at 35 Gb/s. The measured SNR of the eye diagram of Si-PD 600 of FIG. 6A is better than the Si-PDs 400 and 500 due to the larger responsivity and larger 3-dB bandwidth.

Figure 14:
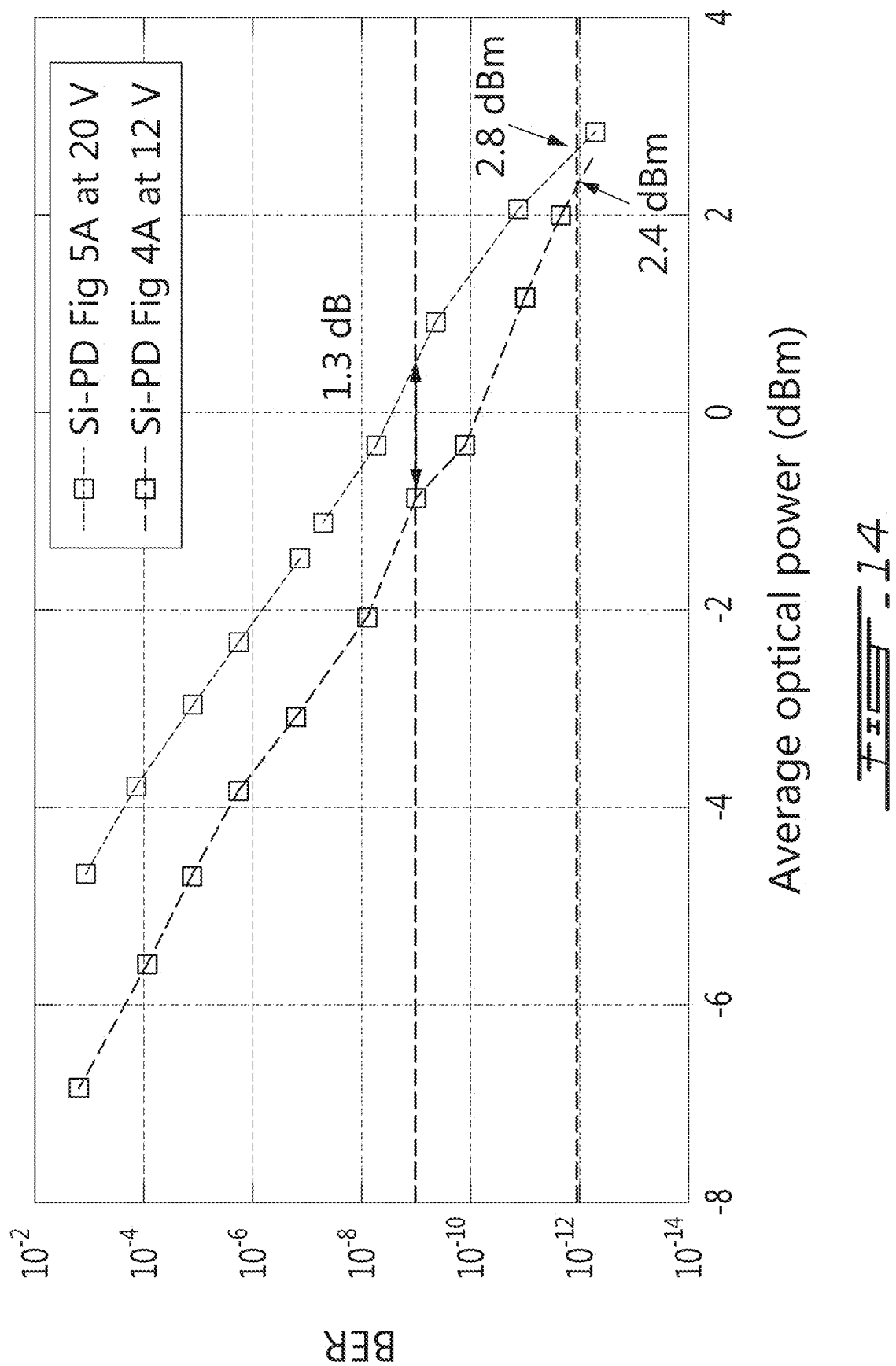
FIG. 14 is a graph showing BER measurements for the Si-PD of FIGS. 4A, 5A and 6A for 10 Gb/s PRBS-31 OOK-NRZ data.

The BERs for the Si-PD 400 of FIG. 4A and the Si-PD 500 of FIG. 5A are measured at 10 Gb/s. The off-the-shelf 12 GHz amplifier for BER measurements degrades the SNR of the amplified signal due to the 3 dB noise figure of the amplifier. Further, due to the limited power budget and noise floor of the optical link, the BER measurements are limited to 10 Gb/s PRBS-31 OOK-NRZ data (FIG. 14). The Si-PD 400 of FIG. 4A has a slightly better sensitivity (0.4 dB) for BER at $10^{-12}$ in comparison with Si-PD 500 of FIG. 5A. The improvement is 1.3 dB at BER of $10^{-9}$.

Table 1 summarizes the performance of the proposed SOI-based grating-assisted Si-PDs and compares them with previously published high-speed Si-PDs. For comparison, a figure of merit (FoM) is defined as FoM=R (mA/W)×BW (GHz), using two important photodetector parameters, responsivity (R) and bandwidth (BW). Based on the FoM values, the proposed grating-assisted Si-PDs provide excellent performance. The optimized design (Si-PD of FIG. 6A) has the FoM value of 4920 GHz×mA/W by at least 35% larger than other published Si-PDs. The grating coupler enables the fabrication of Si-PDs with reasonable responsivity and larger bandwidth without relying on equalization techniques. Further, the small parasitic capacitor of the proposed Si-PDs makes the design of a downstream transimpedance amplifier stage less challenging for high-speed applications.

TABLE 1

Summary of the proposed grating-assisted Si-PDs performance of the proposed Si-PDs 300, 400, 500 and 600.

| Si-PD | R (A/W) | Dark current | Capacitor (fF) | Bandwidth (GHz) | Bias voltage (V) | FoM GHz × mA/W |
|---|---|---|---|---|---|---|
| 300 | 0.32 | 1 nA | 0.27** | 4.7 | 20 | 1504 |
| 400 | 0.153 | 0.4 nA | 0.69** | 15 | 12 | 2295 |
| 500 | 0.155 | 16 nA | 4.1** | 13.1 | 20 | 2030 |
| 600 | 0.3 | 2 µA | 2.3** | 16.4 | 14 | 4920 |

*Capacitor is extracted from the equivalent small-signal model of the APD.
**Capacitor is estimated based on the dimensions of the p-i-n diode in the Si-PD.

Accordingly, Si-PDs 300, 400, 500 and 600 are can advantageously be used for 850 nm wavelength applications while being fabricated using existing silicon-on-insulator (SOI) technology. As discussed above, the proposed photodetectors 300, 400, 500 and 600 use grating couplers to couple the injected light to the silicon waveguide for an efficient absorption. The grating coupler in the baseline design increases the responsivity by 40 times compared with the PD without a grating coupler. It was experimentally shown that the tradeoff between speed and responsivity for various designs of the Si-PD. The proposed Si-PDs 300, 400, 500 and 600 provide promising performance in terms of responsivity and bandwidth. The optimized design of the grating-assisted Si-PD has a responsivity of 0.3 A/W, an avalanche gain of 6, a dark current of 2 µA, and a 3-dB bandwidth of 16.4 GHz at 14 V reverse-bias voltage that leads to a FoM of 4920 GHz×mA/W for this photodetector. Further, it shows an open eye diagram for 35 Gb/s PRBS-31 NRZ-OOK data at this bias voltage.

FIG. 15 is an example of an optical receiver 1560, in accordance with an embodiment. As depicted, the optical receiver 1560 has a substrate 1504 and a photodetector 1500 mounted to the substrate 1504. The photodetector 1500 has an i-type semiconductor region 1506 which is mounted to the substrate 1504. As shown, the i-type semiconductor region 1506 has a length I. Moreover, the photodetector 1500 has p-type and n-type semiconductor regions 1508 and 1510 which are mounted to the substrate 1504 and which sandwich the i-type semiconductor region 1506 along at least the length I. A grating coupler 1512 is mounted to the substrate 1504 so as to be optically coupled to one of two ends of the i-type semiconductor region 1506. As such, the grating coupler 1506 can redirect an incoming optical data signal 1562 into and along the i-type semiconductor region 1506 via the one of the two ends of the i-type semiconductor region 1506 for propagation of the optical data signal 1562 along the i-type semiconductor region 1506. Electrical contacts 1522 are electrically connected to the p-type and n-type semiconductor regions 1508 and 1510 in this example. In addition, an output signal processing circuit 1564 is electrically connected to the electrical contacts 1522 of the photodetector 1500. As can be understood, the output signal processing circuit 1564 is configured for outputting an electrical data signal 1566 based on a photocurrent resulting from the propagation of the optical data signal 1562 along the p-i-n diode.

In the illustrated embodiment, the output signal processing circuit 1564 has an amplification circuit 1568, a processing unit 1570, and a control unit 1572 communicatively coupled to one another so as to output the electrical data signal 1566. However, in alternate embodiments, the output signal processing unit 1564 can be configured otherwise. For instance, examples of such configurations are described in the scientific publication "Fard, Monireh Moayedi Pour, Odile Liboiron-Ladouceur, and Glenn ER Cowan. "1.23-pJ/bit 25-Gb/s Inductor-Less Optical Receiver With Low-Voltage Silicon Photodetector." IEEE Journal of Solid-State Circuits 53.6 (2018): 1793-1805", which is hereby incorporated by reference.

It is noted that in the depicted embodiment, the photodetector 1500 and the output signal processing unit 1564 are both made integral to the same substrate, i.e., the substrate 1504, so as to provide a monolithically integrated optical receiver 1560. It was found that such a monolithically integrated optical receiver can circumvent parasitic bondwire inductance and/or parasitic pad capacitance generally associated to optical receivers having wire-bonding between their photodetector and output signal processing unit.

As can be understood, the examples described above and illustrated are intended to be exemplary only. The scope is indicated by the appended claims.

What is claimed is:

1. A photodetector comprising: a substrate; an i-type semiconductor region being mounted to the substrate and having a length extending between two longitudinal ends of the i-type semiconductor region, p-type and n-type semiconductor regions being mounted to the substrate and sandwiching the i-type semiconductor region along at least said length; a grating coupler being mounted to the substrate and being optically coupled to one of the two longitudinal ends of the i-type semiconductor region, the grating coupler redirecting incoming light into and along the i-type semiconductor region via the one of the two longitudinal ends of the i-type semiconductor region for propagation of said light along the i-type semiconductor region; and electrical contacts electrically connected to the p-type semiconductor region and to the n-type semiconductor region.

2. The photodetector of claim 1 wherein the grating coupler is a focusing grating coupler being configured for focusing said incoming light into the one of the two longitudinal ends of the i-type semiconductor region.

3. The photodetector of claim 1 wherein at least the substrate, the i-type semiconductor region, and the grating coupler include silicon.

4. The photodetector of claim 3 wherein said length is at least greater than a penetration depth of said light into bulk silicon.

5. The photodetector of claim 1 wherein said length is at least 10 µm, preferably greater than about 25 µm and most preferably greater than about 50 µm.

6. The photodetector of claim 1 wherein the i-type semiconductor region has a width ranging between about 0.3 µm and about 5 µm.

7. The photodetector of claim 1 wherein the p-type semiconductor region has a proximal p+ semiconductor region and a distal p++ semiconductor region, the n-type semiconductor region having a proximal n+ semiconductor region and a distal n++ semiconductor region.

8. The photodetector of claim 1 wherein the i-type semiconductor region is a first i-type semiconductor region, the photodetector further comprising at least a second i-type semiconductor region mounted to the substrate, parallel to the first i-type semiconductor region, and sandwiched between p-type and n-type semiconductor regions.

9. The photodetector of claim 1 wherein the i-type semiconductor region has an absorption window at about 850 nm.

10. An optical receiver comprising:
a substrate;
a photodetector having an i-type semiconductor region being mounted to the substrate and having a length extending between two longitudinal ends of the i-type semiconductor region, p-type and n-type semiconductor regions being mounted to the substrate and sandwiching the i-type semiconductor region along at least said length; a grating coupler being mounted to the substrate and being optically coupled to one of two longitudinal ends of the i-type semiconductor region, the grating coupler redirecting an incoming optical data signal into and along the i-type semiconductor region via the one of the two longitudinal ends of the i-type semiconductor region for propagation of said optical data signal along the i-type semiconductor region; and electrical contacts electrically connected to the p-type semiconductor region and to the n-type semiconductor region; and
an output signal processing circuit being electrically connected to the electrical contacts of the photodetector and being configured for outputting an electrical data signal based on a photocurrent resulting from said propagation.

11. The optical receiver of claim 10 wherein the photodetector and the output signal processing circuit are both made integral to said substrate.

12. The optical receiver of claim 10 wherein the output signal processing circuit has an amplification circuit.

13. The optical receiver of claim 12 wherein the amplification circuit includes a transimpedance amplifier (TIA).

14. The optical receiver of claim 10 wherein the grating coupler is a focusing grating coupler being configured for focusing said incoming light into the one of the two longitudinal ends of the i-type semiconductor region.

15. The optical receiver of claim 10 wherein at least the substrate, the i-type semiconductor region and the grating coupler include silicon.

16. The optical receiver of claim 15 wherein said length is at least greater than a penetration depth of said light into bulk silicon.

17. The optical receiver of claim 10 wherein said length is at least 10 µm, preferably greater than about 25 µm and most preferably greater than about 50 µm.

18. The optical receiver of claim 10 wherein the i-type semiconductor region has a width ranging between about 0.3 µm and about 5 µm.

19. The optical receiver of claim 10 wherein the i-type semiconductor region has an absorption window at about 850 nm.

20. A photodetector for detecting incoming infrared light, the photodetector comprising: a substrate; an i-type semiconductor region extending along the substrate, between two longitudinal ends of the i-type semiconductor region, the i-type semiconductor region being sandwiched between a p-type semiconductor region and an n-type semiconductor region; a grating coupler being optically connected to one of two longitudinal ends of the i-type semiconductor region, the grating coupler redirecting incoming infrared light into and along the i-type semiconductor region via the one of the two longitudinal ends of the i-type semiconductor region for propagation of infrared light along the i-type semiconductor region; and a photocurrent detection circuit electrically connected to the p-type semiconductor region and to the n-type semiconductor region for detecting a photocurrent resulting from said propagation.

* * * * *